(12) United States Patent
Maheshwari (10) Patent No.: US 7,814,268 B2
(45) Date of Patent: Oct. 12, 2010

(54) ROW EXPANSION REDUCTION BY INVERSION FOR RANGE REPRESENTATION IN TERNARY CONTENT ADDRESSABLE MEMORIES

(75) Inventor: Dinesh Maheshwari, Fremont, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/072,361

(22) Filed: Feb. 25, 2008

(65) Prior Publication Data

US 2008/0155189 A1 Jun. 26, 2008

Related U.S. Application Data

(63) Continuation of application No. 11/218,366, filed on Sep. 1, 2005, now Pat. No. 7,366,830.

(51) Int. Cl.
*G06F 12/00* (2006.01)
(52) U.S. Cl. ........................ 711/108; 711/154; 711/156; 365/49.1
(58) Field of Classification Search .................. 711/108, 711/154, 156; 365/49.1
See application file for complete search history.

(56) References Cited

U.S. PATENT DOCUMENTS 6,633,953 B2 * 10/2003 Stark .......................... 711/108
7,366,001 B2 * 4/2008 Hanzawa et al. ........... 365/49.1

OTHER PUBLICATIONS

U.S. Appl. No. 11/218,366, Not Published, Maheshwari.

* cited by examiner

*Primary Examiner*—Stephen C Elmore
(74) *Attorney, Agent, or Firm*—Haverstock & Owens, LLP (57) ABSTRACT

A method and circuit to implement a match against range rule functionality. A first rule entry and a second rule entry are stored. The first rule entry includes at least two consecutive identical bits. The first rule entry represents a numerical range. A first field of a binary key is compared with the first rule entry to determine whether any of the bits of the first field are not identical. A logical result of the comparison between the first field and the first rule entry is inverted to generate a first comparison result. A second field of the binary key is compared with a second rule entry to generate a second comparison result. The first comparison result is then logically ANDed with the second comparison result to determine whether the binary key falls within the numerical range represented by the first rule entry and matches the second rule entry.

19 Claims, 7 Drawing Sheets

FIG. 1

| RULE # | RULE DESCRIPTION |
|---|---|
| 1 | DENY ALL TRAFFIC FROM SOURCE IP ADDRESSES 66.77.* |
| 2 | ALLOW ONLY HTTP REQUESTS (TCP DEST. PORT 80) TO DESTINATION IP ADDRESSES 15.24.* |
| 3 | DENY UDP PACKETS TO DESTINATION PORTS LESS THAN OR EQUAL TO 255 |
| 4 | ALLOW UDP PACKETS TO DESTINATION PORTS GREATER THAN OR EQUAL TO 256 |

| RULE # | SOURCE IP ADDRESS | DEST. IP ADDRESS | SOURCE PORT | DEST. PORT | PROTO ID | ACTION |
|---|---|---|---|---|---|---|
| 1 | 66.77.XX.XX | XX.XX.XX.XX | XXXX | XXXX | XX | DENY |
|   | FF.FF.00.00 | 00.00.00.00 | 0000 | 0000 | 00 |   |
| 2 | XX.XX.XX.XX | 15.24.XX.XX | XXXX | 0050 | 06 | ALLOW |
|   | 00.00.00.00 | FF.FF.00.00 | 0000 | FFFF | FF |   |
| 3 | XX.XX.XX.XX | XX.XX.XX.XX | XXXX | 00XX | 11 | DENY |
|   | 00.00.00.00 | 00.00.00.00 | 0000 | FF00 | FF |   |
| 4 | XX.XX.XX.XX | XX.XX.XX.XX | XXXX | 01XX | 11 | ALLOW |
|   | 00.00.00.00 | 00.00.00.00 | 0000 | FF00 | FF |   |
|   | XX.XX.XX.XX | XX.XX.XX.XX | XXXX | 02XX | 11 |   |
|   | 00.00.00.00 | 00.00.00.00 | 0000 | FF00 | FF |   |
|   | ⋮ | ⋮ | ⋮ | ⋮ | ⋮ |   |
|   | XX.XX.XX.XX | XX.XX.XX.XX | XXXX | FFXX | 11 |   |
|   | 00.00.00.00 | 00.00.00.00 | 0000 | FF00 | FF |   |

ROW EXPANSION REDUCTION BY INVERSION FOR RANGE REPRESENTATION IN TERNARY CONTENT ADDRESSABLE MEMORIES

This application is a continuation of U.S. patent application Ser. No. 11/218,366 filed on Sep. 1, 2005 now U.S. Pat. No. 7,366,830 issued on Apr. 29, 2008, the contents of which are incorporated by reference herein.

TECHNICAL FIELD

This disclosure relates generally to range matching, and in particular but not exclusively, relates to range matching in Ternary Content Addressable Memories ("TCAMs").

BACKGROUND INFORMATION

As information network systems continue to proliferate, network processing applications and hardware for processing packets quickly and efficiently are increasingly important. Network switches and/or routers receive packets, extract information from the packet header/footers, and process the packets according to the extracted information. Network header information can establish, to name just a few possible examples, the destination of a packet and/or the manner in which a packet should be transmitted.

Packet routing and/or switching typically utilizes a matching function. In a matching function, a header field (or other packet field) is compared against a number of stored rules. In the event the field (or a portion of the field) matches a stored rule, a match indication is generated. The match indication can be used to take appropriate action on the packet.

Figure 1:
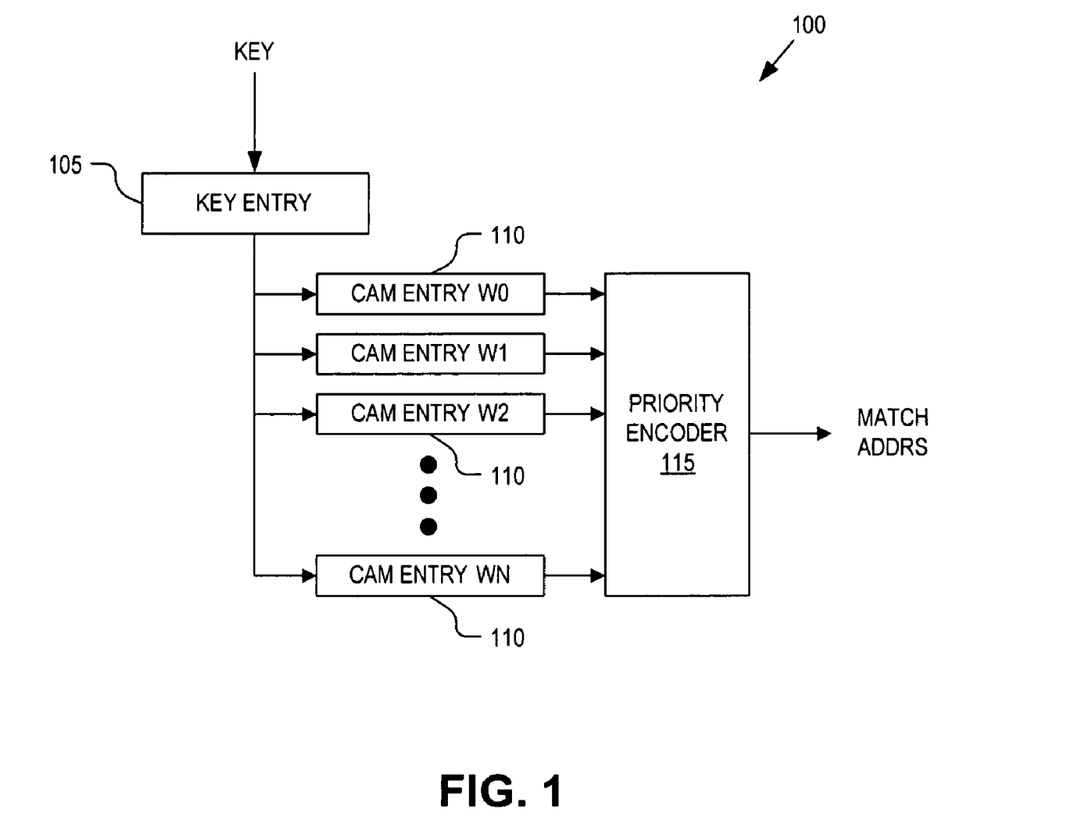
FIG. 1 is a block diagram illustrating a conventional content addressable memory ("CAM") array.

One device that is particularly suitable for implementing matching functions is a content addressable memory ("CAM"), also referred to as an "associative memory." FIG. 1 illustrates a conventional CAM array 100. CAM array 100 includes a key register 105 to store a key entry, a plurality of CAM cells 110 each to store a CAM entry W0-WN (also referred to as rule entries), and a priority encoder 115. CAM cells 110 are addressed according to the contents (i.e., CAM entries W0-WN) that they store. In a typical CAM matching function, a key (which can be a header field or a portion thereof) is loaded into key register 105 as the key entry. The key entry is then compared to each of the CAM entries W0-WN stored within CAM cells 110. In the event the key entry matches one of the CAM entries, a match signal for the matching CAM cell 110 is generated. In the event there is more than one match, the highest priority match(es) may be selected according to predetermined priority criteria implemented by priority encoder 115. Priority encoder 115 then outputs a match address identifying which CAM entry was a "hit" or match with the key entry.

CAM array 100 typically comes in two flavors a "binary" CAM array and a "ternary" CAM ("TCAM") array. In a binary CAM array, the multi-bit key entry must exactly match every bit of a CAM entry to generate a hit. In a TCAM array, the multi-bit key entry can be compared with "maskable" bits of the CAM entries. Therefore, only the non-masked bits of the CAM entries must exactly match to generate a hit. Therefore, a masked bit of a CAM entry will not generate a mismatch indication even if the masked bit value is different than the corresponding bit value of the key entry.

Cam array 100 is well suited for use with network search engines, access control lists ("ACLs"), and other high density, high speed matching functions. One type of match function is a match against range rule ("MARR"). With MARR multiple CAM entries are stored to represent a single range rule (e.g., a<47). If the key entry happens to fall within a range stored with CAM cells 110, one or more of CAM cells 110 will generate a hit. Implementing a greater than X or less than X range rule within a convention CAM array, such as CAM array 100, requires up to $2*W-1$ entries, where W is the number of bits in the binary representation of the range. For example, the range a<47 (or a<101111 in binary) would require six CAM entries, one for each bit of the binary representation, and therefore consume six rows of CAM cells 110 of CAM array 100. When implementing MARR with a large number of rules or with large ranges, the number of CAM cells 110 can be extremely large. The more CAM cells 110 needed, the larger the semiconductor real estate occupied and the greater the power consumed.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for efficiently implementing a match against range rule ("MARR") are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
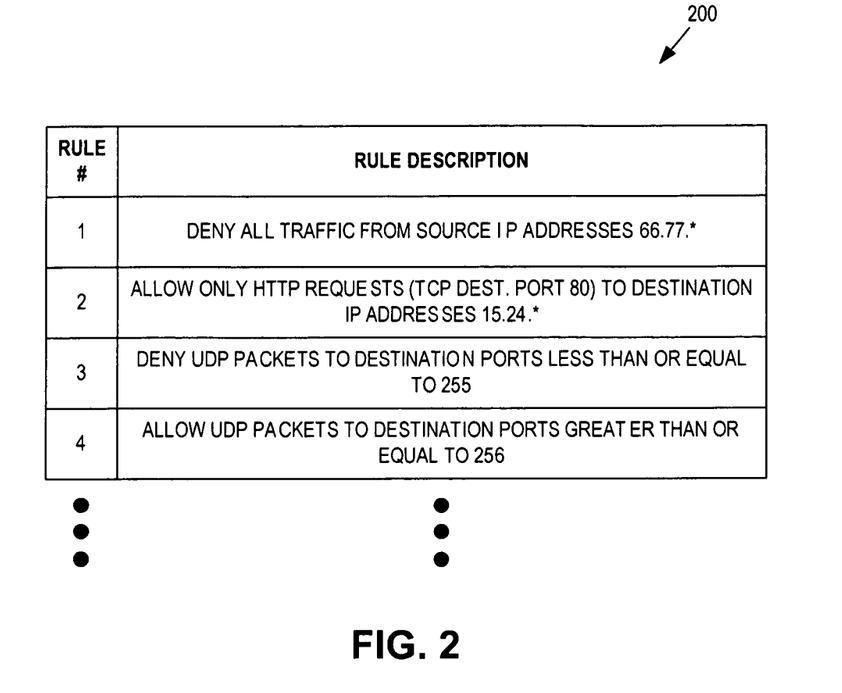
FIG. 2 is a table illustrating range rule descriptions for use with an access control list, in accordance with an embodiment of the invention.

FIG. 2 is a table 200 illustrating range rule descriptions for use with an access control list ("ACL"), in accordance with an embodiment of the invention. FIG. 2 illustrates four rules with associated descriptions; however, it should be appreciated that table 200 may include any number of rules, perhaps even tens of thousands of rules. Furthermore, embodiments of the invention are not limited for use with ACLs, but may be used in a variety of network applications, network search engine ("NSE") applications, data imagery applications, and the like.

An ACL is a set of rules associated with a file, directory, or other network resource that define the permissions that users, groups, processes, or devices have for accessing the particular resource. For example, rule #1 of table 200 is a rule that states, deny all traffic access to the particular resource (e.g., file, directory, network communication channel, etc.) originating from source IP addresses 66.77.*, where "*" represents a wild card. Therefore, all network traffic with the most significant bits ("MSBs") matching 66.77 will be denied access. Rule #2 states, allow only hypertext transport protocol ("HTTP") traffic heading for destination IP address 15.24.* access to network resources. Since HTTP traffic corresponds to traffic with a transport control protocol ("TCP") destination port 80, at a lower level, rule #2 states allow all traffic with a destination IP address 15.24.* and having a TCP destination port equal to 80. Rule #3 states deny user datagram protocol ("UDP") traffic to destination ports less than or equal to 255. Rule 4 states, allow all UDP traffic to destination ports greater than or equal to 256.

Rules #1-4 are all range type rules. Rules #1 and #2 are maskable ranges, which allow the least significant bits ("LSBs") to be masked while the MSBs are exactly matched. Rules #3 and #4 require actual inspection of the destination port range to determine whether or not it is less than or equal to 255 or greater than or equal to 256.

Figure 3:
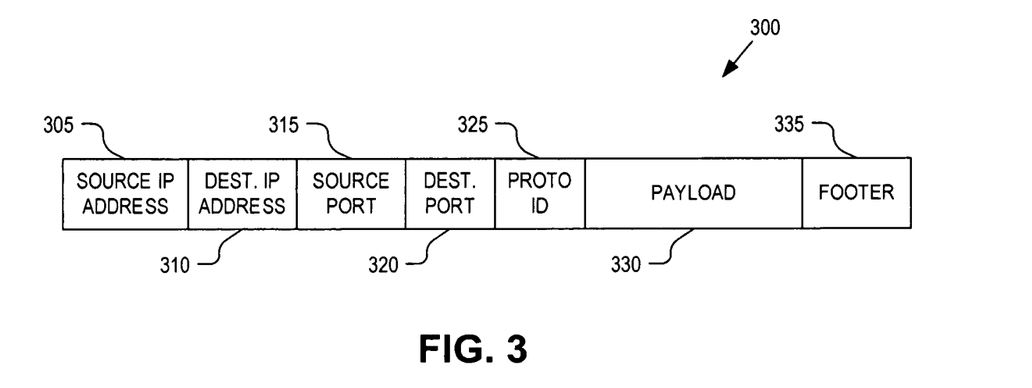
FIG. 3 is a block diagram illustrating a packet including various packet fields for matching against range rules, in accordance with an embodiment of the invention.

FIG. 3 is a block diagram illustrating a packet 300 including various packet fields for matching against range rules, in accordance with an embodiment of the invention. The illustrated embodiment of packet 300 includes a source IP address field 305, a destination IP address field 310, a source port field 315, a destination port field 320, a proto ID field 325, a payload field 330, and a footer field 330. The packet fields including source IP address 305, destination IP address 310, source port 315, destination port 320, and proto ID 325 together are often referred to as the header field of packet 300. It should be appreciated that packet 300 may include other packet fields not illustrated or may omit some fields illustrated and may even be arranged in a different order than illustrated.

Source IP address field 305 and destination IP address field 310 contain the source IP address and destination IP address, respectively, of the particular packet 300. Source port field 315 may contain a machine specific port number to which any response should be sent. Destination port field 320 may contain an application specific protocol identifier, such as file transfer protocol ("FTP") identifier, an HTTP identifier, and the like. Proto ID field 325 may contain various protocol identifiers, such as TCP, UDP, L4 protocol, and the like. Payload field 330 contains the actual data to be transmitted, while footer field 335 may contain error verification data, such as cyclical redundancy checking ("CRC") bits.

The various packet fields of packet 300 may be parsed by a network processing unit ("NPU"), an NSE, or other processing entity as packet 300 propagates through a network or computer. This parsing may be executed for the purpose of categorizing, determining access permissions to resources, and/or whether to take other actions based on characteristics of packet 300. The parsed packet fields may be compared against the rules illustrated in table 200 to determine what action, if any, should be taken on a particular packet 300. Accordingly, in the case of rule #1, source IP address field 305 would be parsed and the MSBs compared while the LSBs are masked off. In the case of rule #4, destination port field 320 and proto ID field 325 would be parsed, and proto ID field 325 compared to determine if packet 300 is a UDP packet and destination port field 320 compared to determine if it contains a value greater than or equal to 256. In some embodiments, all fields of packet 300 may be parsed and the packet fields of interest, or portions thereof, compared while the remaining packet fields are masked off as "don't cares."

Parsing packet 300 and comparing the contents thereof against rules #1-4 illustrated in table 200 implements a sort of Match Against Range Rule ("MARR") functionality. MARR may entail receiving an incoming packet 300, parsing the received packet 300, using the parsed packet fields as a sort of "key" to match against a list or database of range rules. If a "hit" or match is determined between the key and the database of range rules, then the actions associated with the one or more matching range rules may be executed.

Figure 4:
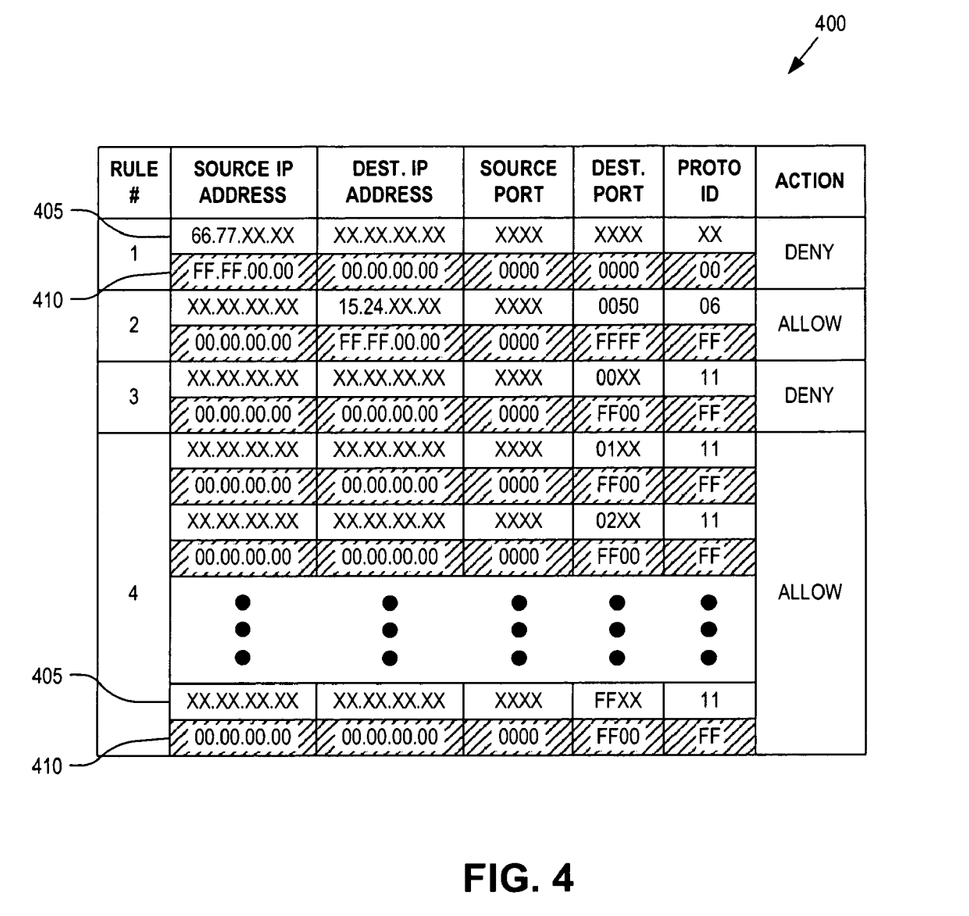
FIG. 4 is a table illustrating an access control list including a variety of match against range rules, in accordance with an embodiment of the invention.

FIG. 4 is a table illustrating an example ACL 400 including the example range rules described above in connection with table 200. The illustrated embodiment of ACL 400 includes a rule number indexed to an action and to rule entries 405 and mask entries 410 (only a portion of which are labeled) for comparing with packet fields of packet 300. ACL 400 is illustrated using hexadecimal numbers for convenience, but it should be understood that in practice ACL 400 may be implemented using binary numbers.

A "0" listed in mask entries 410 indicates that the corresponding bit positions in rule entries 405 are masked and therefore represent "don't care" bit positions. The masked bit positions, delineated as such by mask entries 410, are represented as an "X" in the corresponding bit positions of rule entries 405. An "F" listed in mask entries 410 indicates that the corresponding bit positions in rule entries 405 are not masked or unmasked, and therefore the actual values are listed in the corresponding positions of rule entries 405.

Using conventional approaches to implement rule #4, one entire row within ACL 400 is needed for each of the eight MSB positions of the binary representation of destination port field 320. With regard to rule #4, each row of a conventional ACL 400 would include a rule entry to check whether each bit position of the eight MSB positions is set. However, as described below, embodiments of the invention are capable of reducing the number of rows or entries within ACL 400 and therefore the number of comparisons needed to represent a single range rule to implement MARR functionality.

Figure 5:
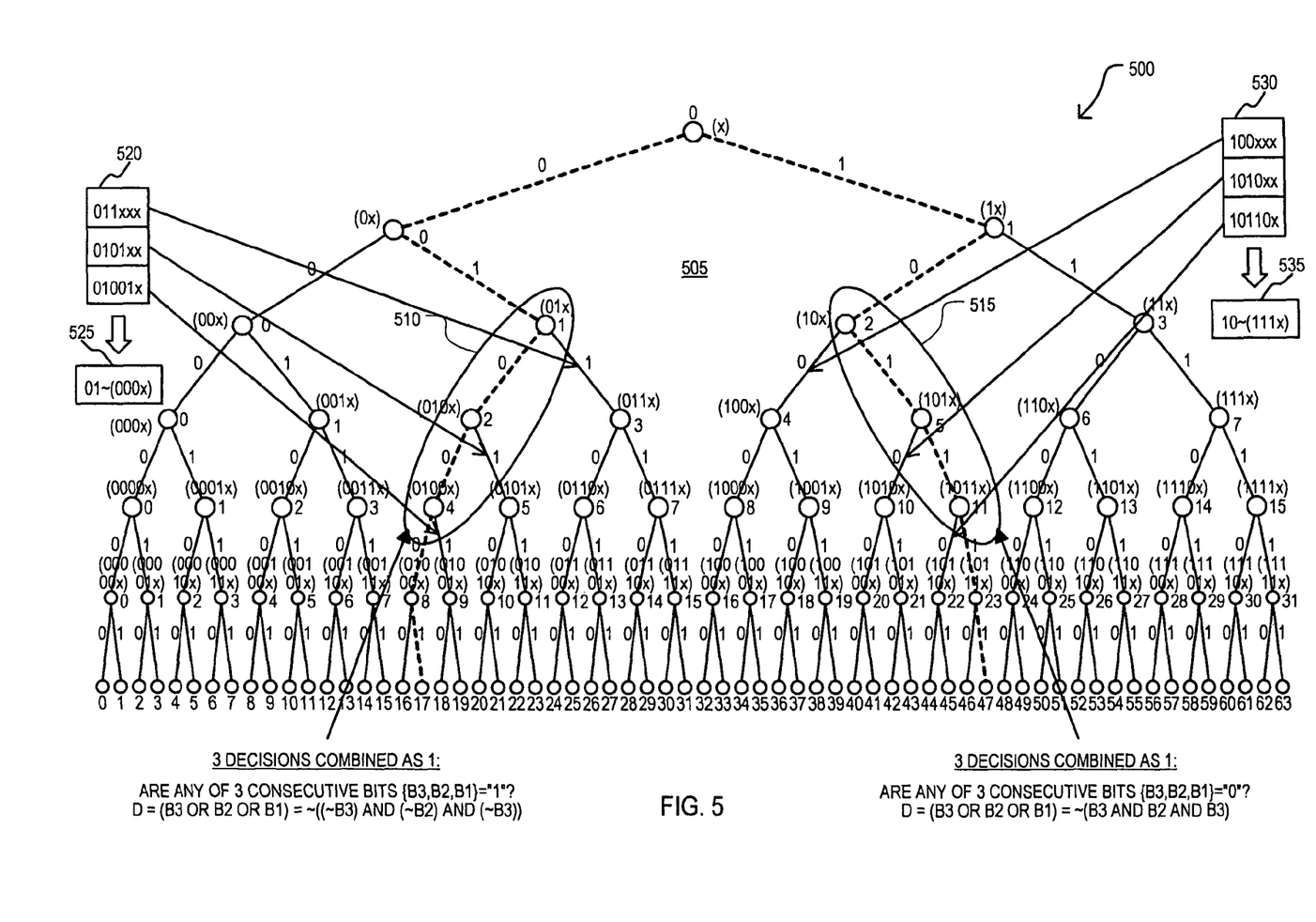
FIG. 5 illustrates how multiple consecutive decision nodes residing along a convex boundary portion of a trie representation of a numerical range can be compressed into a single decision node, in accordance with an embodiment of the invention.

FIG. 5 illustrates a trie structure 500 representing a closed numerical range for "a", where $17 < a < 47$ (decimal representation) or $010001 < a < 101111$ (binary representation). FIG. 5 graphically illustrates how multiple consecutive decision nodes residing along a convex boundary portion of trie structure 500 can be compressed into a single decision node, in accordance with an embodiment of the invention. While trie structure 500 is illustrated as representing the closed numerical range of 17<a<47, it should be appreciated that embodiments of the invention may be extended to any numerical range, whether closed or open.

To determine whether 'a' resides within the numerical range represented by shaded portion 505, a number of conditional decisions must be resolved. These conditional decisions are represented by the nodes or decision nodes of trie structure 500. Conventional approaches would require six comparisons and therefore six entries in ACL 400 to determine whether 'a' is greater than 17 and an additional five comparisons or five entries in ACL 400 to determine whether 'a' is less than 47 (note the upper most trunk decision node is only counted once and the bottom or leaf nodes are not counted since they do not represent a decision to be made).

Embodiments of the present invention look for consecutive identical bits within the lower and upper bounds of a range and compress the decisions related to these consecutive identical bits into a single combined decision node (e.g., combined decision nodes 510 and 515). With respect to the lower bound of the example range, 17 or 010001, the binary representation includes three consecutive '0' bits. These three consecutive zero bits form a convex shaped boundary. The three decision nodes corresponding to these three consecutive '0' bits can be combined. If the first two MSBs of 'a' are "01" and any of the next three consecutive bits is a '1', then 'a' is greater than 17 (or 010001). The phrase "and any of the next three consecutive bits is a '1'" is represented in FIG. 5 at box 520. However, box 520 can be compressed into a single decision node, represented by box 525.

A similar decision compression may be executed on the upper bound of the example range, 47 or 101111. However, in the upper bound case consecutive '1' bits are sought, and the conventional decisions represented by box 530 can be compressed into a single decision represented by box 535.

For checking whether a field 'y' of an incoming key is greater than a number 'x' it is sufficient to check whether any of the bits of the binary representation for 'y' corresponding to the bits that are '0' in the binary representation for 'x' is '1', while the non-zero bits in the higher binary positions for the highest binary position bit found to be '1' corresponding to a '0' in 'x' are non-zero in 'y'. For example:

to check that a 16 bit field is greater than decimal value 1023 (i.e., binary 0000001111111111) it is sufficient to check if any of the upper 6 bits is '1'.

to check that a 16 bit field is greater than decimal value 1024 (i.e., 0000010000000000) it is sufficient to check:
if any of the upper 5 bits is '1'; or
if the 11$^{th}$ bit is '1' AND any of the lower 10 bits is '1'.

to check that a 16 bit field is greater than decimal value 7170 (i.e., binary 0001110000000010) it is sufficient to check:
if any of the upper 3 bits are 1; or
bit 11-13 are '1' AND any of the bits 3-10 are '1'; or
bits 11-13 AND bits 1-2 are '1'.

Similarly, for checking whether a field 'y' of an incoming key is less than a number 'x' it is sufficient to check whether any of the bits of binary representation for 'y' corresponding to the bits that are '1' in the binary representation for 'x' is '0', while the non-one bits in the higher binary positions for the highest binary position bit found to be '0' corresponding to a '1' in 'x' are non-zero in 'y'. For example:

to check that a 16 bit field is less than decimal value 1023 (i.e., binary 0000001111111111) it is sufficient to check if any of the lower 10 bits is '0', while the upper 6 bits are '0'.

to check that a 16 bit field is less than decimal value 1024 (i.e., 0000010000000000) it is sufficient to check whether bits 11-16 are '0'.

to check that a 16 bit field is less than decimal value 58365 (i.e., binary 1110001111111101) it is sufficient to check:
if any of the upper 3 bits are 0; or
bits 11-13 are '0' AND any of the bits 3-10 are '0'; or
bits 11-13 AND bits 1-2 are '0'.

The technique described above checks if any of a sequence of 'm' bits in a field is '1' or '0' using a single rule entry. Such a check would normally take 'm' rule entries using a conventional approach. To check if any of a sequence of 'm' bits in a field is '1', a single rule entry checks if the sequence of 'm' bits are all '0' bits and inverts the logical result of this check. To check if any of a sequence of 'm' bits in a field is '0', a single rule entry checks if the sequence of 'm' bits are all '1' bits and inverts the logical result of this check.

Accordingly, if a regular match operation of a rule entry can be configurably inverted then the rule entry can be either configured to perform a ternary exact match or check if any of a sequence of 'm' bits in a field is '1' or '0'. A ternary exact match is defined herein as a binary exact match that may include maskable bit positions as "don't cares." In one embodiment, ACL 400 may be implemented in hardware using content addressable memories ("CAMs") or ternary CAMs ("TCAM"). However, it should also be appreciated that ACL 400 and the techniques described herein may be partially or wholly implemented in software. In one embodiment, two CAM entries of the same width are configured to be ANDed together to implement MARR on a range field and a ternary exact match on a ternary match field of a single key entry. These two fields (the range field and the ternary match field) need not be aligned with word boundaries, but rather may have any position of any size within the key entry. The following examples illustrate this:

to check that a 16 bit field is greater than decimal value 1023 (i.e., binary 0000001111111111) it is sufficient to check if any of the upper 6 bits is '1'
first CAM entry is used to check if any of the upper 6 bits of the field are '1'
second CAM entry is used to perform a ternary exact match on the rest of the key entry
the two CAM entries are logically ANDed together.

to check that a 16 bit field is greater than decimal value 1024 (i.e., 0000010000000000) it is sufficient to check:
if any of the upper 5 bits is '1'
first CAM entry is used to check if any of the upper 5 bits of the range field are '1'
second CAM entry is used to perform a ternary exact match on the rest of the key entry
the two CAM entries are configured to be logically ANDed together
or, if the 11$^{th}$ bit is '1' and any of the lower 10 bits is '1'
first CAM entry is used to check if any of the lower 10 bits of the range field are '1'
second CAM entry is used to perform a ternary exact match on the rest of the key entry AND that the 11$^{th}$ bit is '1'
the two CAM entries are configured to be logically ANDed together.

to check that a 16 bit field is greater than decimal value 7170 (i.e., 0001110000000010) it is sufficient to check:

if any of the upper 3 bits is '1'
  first CAM entry is used to check if any of the upper 3
    bits of the range field are '1'
  second CAM entry is used to perform a ternary exact
    match on the rest of the key entry
  the two CAM entries are configured to be logically
    ANDed together
or, if bits 11-13 are '1' and any of bits 3-10 are '1'
  first CAM entry is used to check if any of bits 3-10 of
    the range field are '1'
  second CAM entry is used to perform a ternary exact
    match on the rest of the key entry AND that bits
    11-13 are '1'
  the two CAM entries are configured to be logically
    ANDed together
or, if bits 11-13 are '1' and bits 1-2 are '1'
  one CAM entry is used to perform the ternary exact
    match on the rest of the key and check that bits
    11-13 and bits 1-2 are '1'.

Accordingly, in each of the above examples, a first CAM entry matches only the range field(s) while the rest of the fields are masked off and a second CAM entry performs the ternary exact match on the rest of the fields while the range field(s) are masked off. The results of the matches on the two CAM entries are logically ANDed together to give the match result on a particular range rule.

From the above examples, it can be readily seen that for a "greater than 'x' check" on a field (e.g., any of the packet fields of packet 300 or portion thereof) the reduction in the number of CAM entries required for a TCAM using the above MARR compression technique (also referred to as row expansion reduction by inversion) as compared with conventional techniques is given by:

$$\sum_{i=0}^{z}(u_1 - 2) \quad \text{(Equation 1)}$$

where 'z' is the number of contiguous sequences of '1' having two or more '1' bits and $u_i$ is the number of contiguous "1's" in each sequence $u_i$.

Figure 6A:
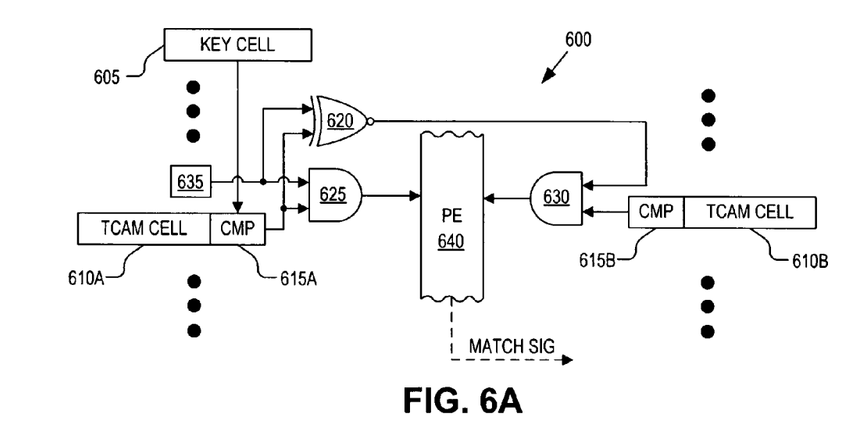
FIG. 6A is a block diagram illustrating a portion of a ternary CAM ("TCAM") array modified to efficiently implement match against range rule functionality, in accordance with an embodiment of the invention.

FIG. 6A is a block diagram illustrating a portion of a TCAM array 600 modified to efficiently implement MARR functionality, in accordance with an embodiment of the invention. The illustrated portion of TCAM array 600 includes a key cell 605, TCAM cells 610A and 610B (collectively 610), comparators 615A and 615B (collectively 615), an inverter circuit 620, ANDing circuits 625 and 630, a storage element 635, and a priority encoder 640.

In the illustrated embodiment, inverter circuit 620 is represented as a logical XNOR gate; however, it is appreciated that other circuit components may implement the logical inversion functionality of inverter circuit 620. Similarly, ANDing circuit 625 and 630 are illustrated as logical AND gates, but again these circuit elements may be substituted for other circuit elements capable of implementing a logical ANDing function. In one embodiment, comparators 615 are implemented with match sense amplifiers. In one embodiment, key cell 605 and TCAM cells 610 are implemented with multi-bit hardware registers; however, other components may be substituted including multi-bit memory cells, multi-bit buffers, multi-bit latches, random access memory ("RAM"), and the like. Storage element 635 may be implemented with a variety of storage components including a register, a latch, a memory buffer, a memory cell, and the like.

The illustrated components of TCAM array 600 interoperate as follows. TCAM cells 610 each store a rule entry or CAM entry (e.g., rule entry 405) and key cell 605 stores a key entry. Either one of TCAM cells 610 can mask bit positions of their respective CAM entries to perform ternary exact matches (e.g., per mask entries 410). If the CAM entry of either TCAM cell 610 matches the key entry of key cell 605, then the corresponding comparator 615 will assert a comparison result signal indicating the match. In one embodiment, TCAM cells 610 are each the same width as key cell 605 and therefore store data of equivalent or less size.

Storage element 635 stores an inversion configuration bit. When the inversion configuration bit is set or '1', ANDing circuit 625 is enabled and inverter circuit 620 is configured as a simple logic follower or repeater outputting the same logic level it receives from comparator 615A. When the inversion configuration bit is cleared or '0', inverter circuit 620 is configured as an inverter and outputs a logical inversion of the comparison result signal received from comparator 615A. The output of inverter circuit 620 is logically ANDed with the comparison result signal from comparator 615B by ANDing circuit 630, which in turn provides a joint comparison result signal to priority encoder 640. If the joint comparison result signal is asserted by ANDing circuit 630 (or any other row of TCAM array 600 not illustrated), then priority encoder 640 will assert a match signal indicating which row of TCAM cells 610 matched the key entry.

As illustrated, TCAM cells 610A and 610B are coupled to operate as a single row of TCAM array 600. However, it should be appreciated that decouple logic may be inserted between the output of inverter circuit 620 and the input of ANDing circuit 630 to decouple inverter circuit 620 and assert a logic '1' to ANDing circuit 630. With ANDing circuit 630 decoupled from inverter circuit 620, TCAM cell 610B can be loaded with a different TCAM entry than TCAM cell 610A and therefore operate as a separate row.

Figure 6B:
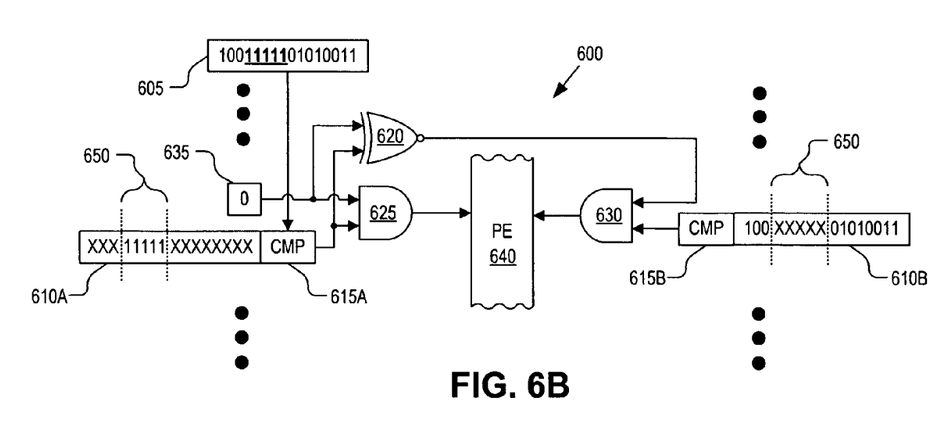
FIG. 6B is a block diagram illustrating a portion of a TCAM array modified to efficiently implement match against range rule functionality, in accordance with an embodiment of the invention.

FIG. 6B is a block diagram illustrating the same portion of TCAM array 600 in operation, in accordance with an embodiment of the invention. In the illustration, key cell 605 is loaded with a key entry "1001111101010011," TCAM cells 610 are also both loaded with TCAM entries equivalent to the key entry, but having different portions thereof masked. Storage element 635 is cleared with a '0' and therefore inverter circuit 620 is configured to logically invert the comparison result signal received from comparator 615A. With the inversion configuration bit cleared (i.e., '0'), TCAM cells 610 are configured to perform a MARR function, with TCAM cell 610A performing a range match on range field 650 and TCAM cell 610B performing a ternary exact match on the remaining portion of the key entry. Consequently, TCAM cell 610A is configured to perform a greater than operation by checking if any of a sequence of 'm' bits (in the illustration m=5) in range field 650 is '0' using a single TCAM entry. Conventional TCAMs require 'm' TCAM entries or rows to perform this check. However, embodiments of the invention check if any of the sequence of 'm' bits in range field 650 is '0', by checking if the bits of the range field 650 in the key entry (highlighted and underlined in FIG. 6B) are all '1' bits and inverts the logical result of this check using inverter circuit 620. TCAM array 600 is capable of performing this check with a single TCAM entry. Of course, if range field 650 is loaded with '0' bits, then TCAM cell 610A could be configured to check if any of the sequence of bits is a '1' for performing less than operations, as described above.

With the inversion configuration bit set (i.e., '1'), TCAM cells 610 are both configured to perform individual ternary exact matches. With the inversion configuration bit set, TCAM cells 610 may both be loaded with identical TCAM entries or with different TCAM entries. If TCAM cells 610 are loaded with identical TCAM entries, then TCAM cells 610 may be configured to mask different portions of the TCAM entry to perform ternary exact matches on different portions of the key entry. If TCAM cells 610 are loaded with different TCAM entries, then TCAM cells 610 may be used to perform ternary exact matches on key entries having a width $W_{key}=W_{TCAM1}+W_{TCAM2}$, where $W_{TCAM1}$ represents the width of TCAM cell 610A and $W_{TCAM2}$ represents the width of TCAM cell 610B.

Using the techniques described herein, TCAM array 600 can support the same number of match rules (range match rules or ternary exact match rules) with fewer TCAM cells (rule entries) than conventional techniques. As such, more match rules can be supported for a given number of TCAM cells. The decision node compression supported by TCAM array 600 decreases power consumption and semiconductor real estate needed to support a given number of match rules. For example, referring to FIG. 5, the range 17<a<47 requires 11 TCAM entries using conventional approaches, but only 7 TCAM entries using the techniques described herein. Accordingly, available TCAM resources (hardware, power, space, etc.) are more efficiently leveraged when supporting ACLs (e.g., ACL 400), other NSE applications, or the like.

Figure 7:
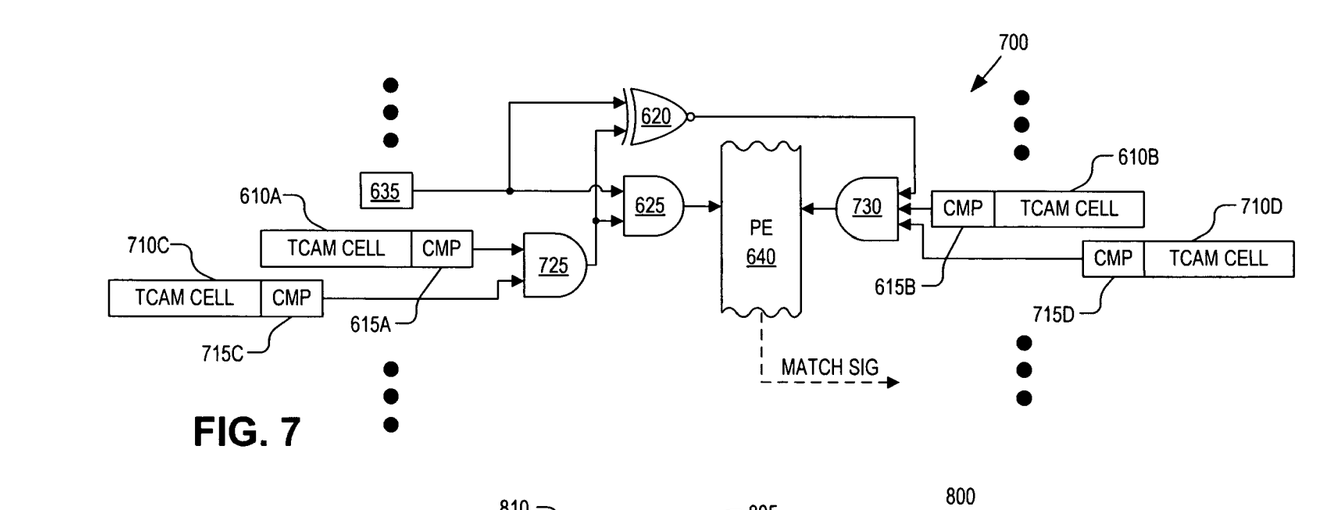
FIG. 7 is a block diagram illustrating a portion of a TCAM array modified to efficiently implement match against range rule functionality over wider key entries, in accordance with an embodiment of the invention.

FIG. 7 is a block diagram illustrating a portion of a TCAM array 700 modified to efficiently implement MARR functionality over wider key entries, in accordance with an embodiment of the invention. The illustrated portion of TCAM array 700 is similar to that of TCAM array 600 with the following exceptions. TCAM array 700 includes two extra TCAM cells 710C and 710D per row of TCAM array 700. The additional TCAM cells 710C and 710D enable wider TCAM entries (e.g., ACL rules, etc) and therefore larger key entries to be compared against. TCAM array 700 adds TCAM cells 710C and 710D via an extra ANDing circuit 725 coupled to logically AND the comparison result signals of comparators 615A and 715C. TCAM cells 610B and 710C are joined using a three input ANDing circuit 730 as opposed to the two input ANDing circuit 630.

Figure 8:
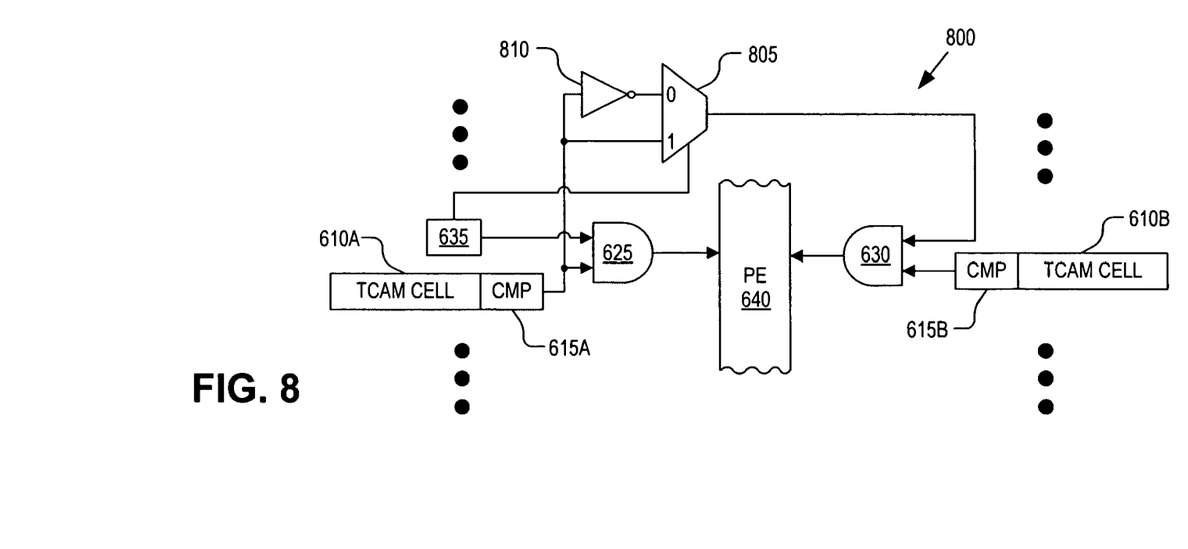
FIG. 8 is a block diagram illustrating a portion of a TCAM array modified to efficiently implement match against range rule functionality using an alternative inverter circuit, in accordance with an embodiment of the invention.

FIG. 8 is a block diagram illustrating a portion of a TCAM array 800 modified to efficiently implement MARR functionality using an alternative inverter circuit, in accordance with an embodiment of the invention. TCAM array 800 is similar to TCAM array 600 with the exception that inverter circuit 620 has been modified. TCAM array 800 illustrates how a multiplexer 805 and inverter gate 810 may be configured to replace the XNOR gate illustrated in FIG. 6A to implement the selective inverter circuit functionality.

Figure 9:
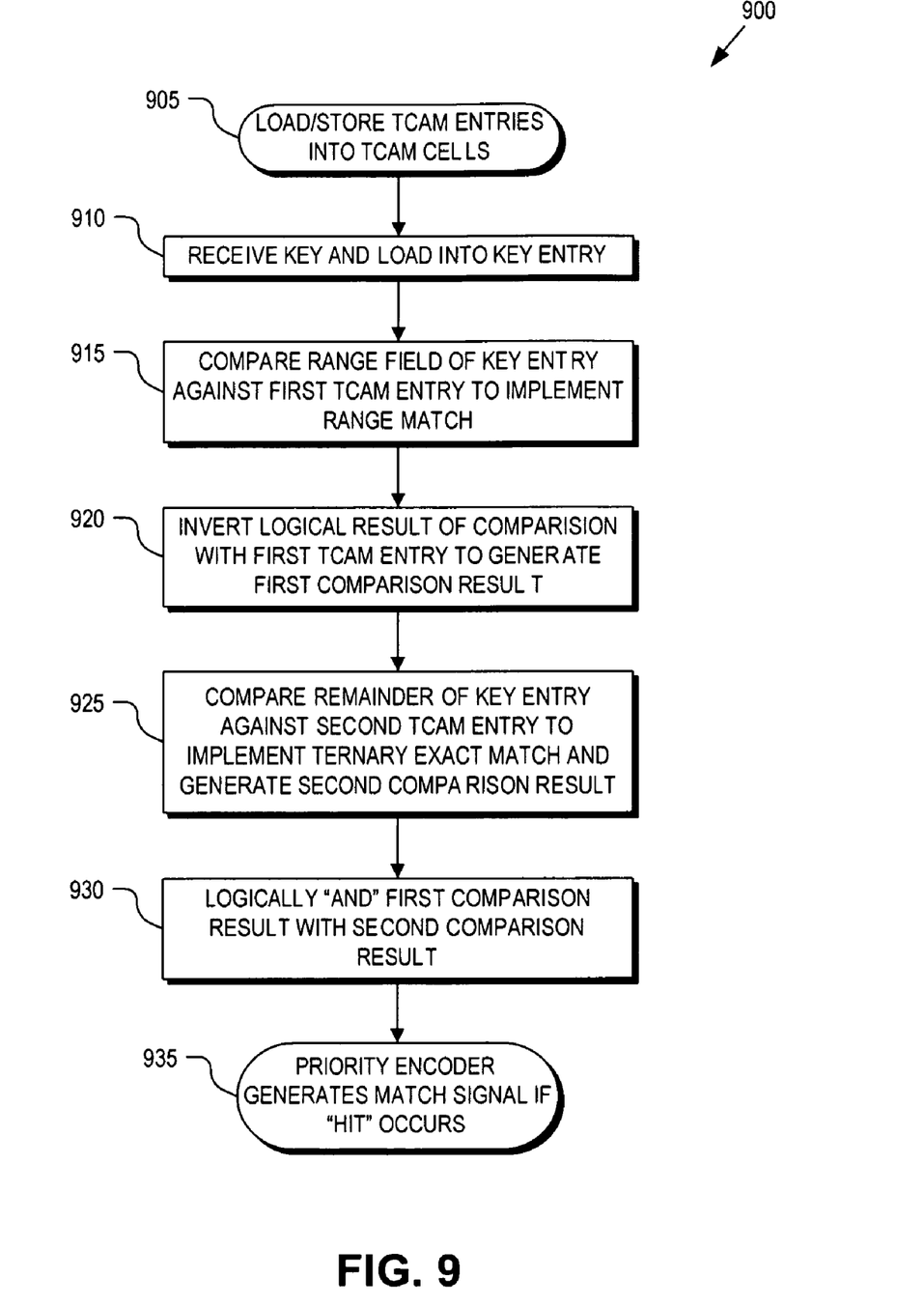
FIG. 9 is flow chart illustrating a process for implementing a match against range rule using a reduced number of rule entries, in accordance with an embodiment of the invention.

FIG. 9 is flow chart illustrating a process 900 for operation of a single row of TCAM array 600 to implement MARR, in accordance with an embodiment of the invention. It should be appreciated that process 900 is equally applicable to TCAM arrays 700, 800, and 900, as well as, software implementations thereof. In fact, the techniques and TCAM arrays described herein can be partially or wholly implemented in software using virtual TCAM arrays, by virtualizing portions of TCAM array 600, 700, 800, or 900, or simply by applying the row expansion reduction by inversion technique described above with machine executable instructions.

The process explained below is described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC"), TCAM array, or the like. The order in which some or all of the process blocks appear in each process should not be deemed limiting. Rather, one of ordinary skill in the art having the benefit of the present disclosure will understand that some of the process blocks may be executed in a variety of orders not illustrated.

In a process block 905, TCAM entries representing rule entries (e.g., rule entries 405) are loaded into TCAM cells 610. In a process block 910, a key is received and loaded into key cell 605 as the key entry. In one embodiment, the key entry is obtained by parsing packet 300 and extracting one or more packet fields therefrom. In one embodiment, multiple packet fields are concatenated into a single key entry.

In a process block 915, a first compare operation is performed between the TCAM cell 610A and the key entry. This first compare operation may compare range field 650 between the TCAM entry and the key entry while masking off the remainder of the TCAM entry. A comparison on the range field 650 is referred to as a "range match." In a process block 920, the logical result of the comparison with TCAM cell 610A is inverted by inverter circuit 620 to generate the first comparison result. The first comparison operation checks for consecutive identical bits to implement "greater than" and "less than" compare operations.

In a process block 925, a second compare operation is performed between TCAM cell 610B and the key entry. It should be appreciated that the first and second compare operations may execute in parallel due to the parallel nature of content addressable memories. This second compare operation compares the remaining portion of the key entry outside of range field 650, and may be referred to as a ternary exact match. The output of the second compare operation generates a second comparison result.

In a process block 930, the first and second comparison results are logically ANDed and the result provided to priority encoder 640. In a process block 935, priority encoder 640 generates a match signal if one of the rows of TCAM cell array 600 has a "hit" with the current key entry.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of representing at least one range in ternary CAM (TCAM) entries, comprising the steps of:
   storing a same data value in at least a first CAM entry and a second CAM entry, the data value having a multi-bit range field that identifies a search range limit;
   in the range field of the first CAM entry masking all bit locations except those bit locations that store a continuous sequence of a first digit; and
   in the range field of the second CAM entry masking those bit locations that store the continuous sequence of the first digit, and unmasking at least a portion of the other bit locations; wherein when the search range limit identifies a lowest value of the range, the first digit is a first binary value, and when the search range limit identifies a highest value of the range the first digit is a second binary value.

2. The method of claim 1, further including:
logically combining match results between a search key value and at least the first CAM entry and the second CAM entry to generate a range search result.

3. The method of claim 2, wherein:
logically combining match results includes asserting a valid range search result when the search key value does not match the first CAM entry and does match the second CAM entry.

4. The method of claim 2, further including:
storing the same data value includes storing different data values in different sets of first and second CAM entries;
logically combining match results includes logically combining match results of first and second CAM entries for each set of the first and second CAM entries; and
prioritizing match results from the sets of first and second CAM entries to generate a prioritized match result.

5. The method of claim 1, further including:
in a first mode of operation, asserting a range match result when the first CAM entry generates a mismatch result and the second CAM entry generates a match result in response to an applied search key value; and
in a second mode of operation, asserting a first match result when the first CAM entry generates a match result in response to an applied search key value, and asserting a second match result when the second CAM entry generates a match result in response to the applied search key value.

6. The method of claim 5, further including:
in the first mode of operation, applying the range match result to a priority encoder circuit and not applying the mismatch result from the first CAM entry to the priority encoder; and
in the second mode of operation, applying the first match result and second match result to the priority encoder.

7. A method, comprising:
in a range match operation applying a search key to at least a first content addressable memory (CAM) entry storing a binary value to generate a first match result, the first CAM entry having all bits but a multi-bit range field masked from a comparison to the search key; and
applying the search key to at least a second CAM entry storing the binary value to generate a second match result, the second CAM entry having all bits of the range field masked and remaining bits unmasked from the comparison to the search key; and
logically combining at least the first and second match results to generate a range match indication.

8. The method of claim 7, wherein:
in the range match operation
activating the first match result if any bit in the multi-bit range field of the first CAM entry does not match a corresponding bit of the search key; and
activating the second match result if the remaining unmasked values match corresponding bits of the search key; and
generating the range match indication includes activating a range match indication in response to at least the first and second match results being activated.

9. The method of claim 7, wherein:
in the range match operation, setting a configuration value to enable match results from the first CAM entry to be logically combined with match results from the second CAM entry; and
in a non-range match operation, setting the configuration value to prevent match results from the first CAM entry from being logically combined with match results from the second CAM entry.

10. The method of claim 7, wherein:
the binary value stored in the first and second CAM entries is a compressed decision value formed with the multi-bit range field corresponding to consecutive identical bits in at least two open ended binary range value, each open range binary range value having a first sequence of binary digits and a second sequence of masked bits.

11. The method of claim 7, wherein:
in the range match operation,
applying the search key to a plurality of first CAM entries, each storing different binary values and having all but a multi-bit range field of a same bit value masked to generate first match results;
applying the search key to a plurality of second CAM entries, each second CAM entry storing the binary value of a corresponding first CAM entry, each second CAM entry having all the multi-bit range fields masked and remaining values unmasked to generate second match results;
logically combining each first match result with a second match results of corresponding second CAM entries to generate a plurality of range match indications; and
prioritizing the range match indications.

12. A memory device, comprising:
a plurality of content addressable memory (CAM) entries, each including a plurality of separately maskable bit locations and providing a match result signal; and
a plurality of logic circuits, each logic circuit being coupled to at least a first CAM entry and a second CAM entry and including
an inverting circuit that inverts at least a match result from the first CAM entry, and
a combining circuit that logically combines at least the match result from the second CAM entry and inverted match result from the first CAM entry to generate a combined match output.

13. The memory device of claim 12, wherein:
the inverting circuit is programmable and inverts the match result of the first CAM entry in a range compare mode and does not invert the match result of the first CAM entry in a non-range compare mode.

14. The memory device of claim 12, wherein:
each logic circuit further includes
a configuration store, and
the inverting circuit inverts the match result of the first CAM entry in response to the configuration store storing a first value, and does not invert the match result of the first CAM entry in response to the configuration store storing a second value.

15. The memory device of claim 12, further including:
a priority encoder circuit that prioritizes match input values to provide a prioritized match signal; and
each logic circuit provides the combined match output as a match input value to the priority encoder.

16. The memory device of claim 15, wherein:
each logic circuit further includes a programmable follower circuit coupled to the first CAM entry that provides an inactive match signal as a match input value to the priority encoder in a range compare mode, and provides a follower match signal as a match input to the priority encoder in a non-range compare mode, the follower match signal following the match result signal of the first CAM entry.

17. The memory device of claim 15, wherein;
each logic circuit further includes
a configuration store, and
a follower circuit coupled to the first CAM entry that provides an inactive match signal as a match input value to the priority encoder when the configuration store stores a first value, and provides the match result signal of the first CAM entry as a match input to the priority encoder when the configuration value store stores a second value.

18. The memory device of claim 12, wherein:
each logic circuit is further coupled to at least a third CAM entry and includes
a secondary combining circuit that logically combines match results of the first and third CAM entries to provide a secondary combined match result,
the inverting circuit inverts the secondary combined match result, and
the combining circuit logically combines the match result from the second CAM entry and the secondary combined match result from the first and third CAM entries to generate the combined match output.

19. The memory device of claim 18, wherein:
each logic circuit is further coupled to at least a fourth CAM entry and includes
the combining circuit logically combining the match result from the second CAM entry, the match result from the fourth CAM entry, and the secondary combined match result from the first and third CAM entries to generate the combined match output.

* * * * *